United States Patent [19]

Blanchard

[11] Patent Number: 4,868,537
[45] Date of Patent: Sep. 19, 1989

[54] DOPED $SiO_2$ RESISTOR AND METHOD OF FORMING SAME

[75] Inventor: Richard A. Blanchard, Los Altos, Calif.

[73] Assignee: Siliconix incorporated, Santa Clara, Calif.

[21] Appl. No.: 95,288

[22] Filed: Sep. 10, 1987

[51] Int. Cl.$^4$ ............................................. H01C 1/012
[52] U.S. Cl. ...................... 338/308; 338/309; 357/51; 357/63
[58] Field of Search .................. 338/308, 309; 357/51, 357/49, 63

[56] References Cited

U.S. PATENT DOCUMENTS 3,922,708  11/1975  Crowder et al. ................. 357/51

Primary Examiner—C. L. Albritton
Attorney, Agent, or Firm—Skjerven, Morrill, MacPherson, Franklin and Friel

[57] ABSTRACT

The concept of enhancing conduction through $SiO_2$ by implanting ions of cesium (Cs) into the $SiO_2$ is applied to the formation of a resistor in an integrated circuit. By implanting Cs ions into a layer of $SiO_2$ in a controlled region of $SiO_2$, and making contact to it via metal electrodes or a conductive polysilicon (poly-Si) layer, a resistor is formed. The resistance of the resistor is determined by the geometry chosen and by the implant dose and implant energy or energies.

6 Claims, 2 Drawing Sheets

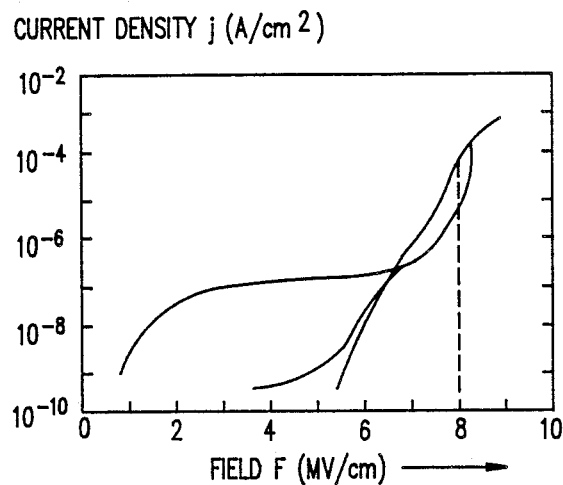
FIG. 4
(Prior Art)
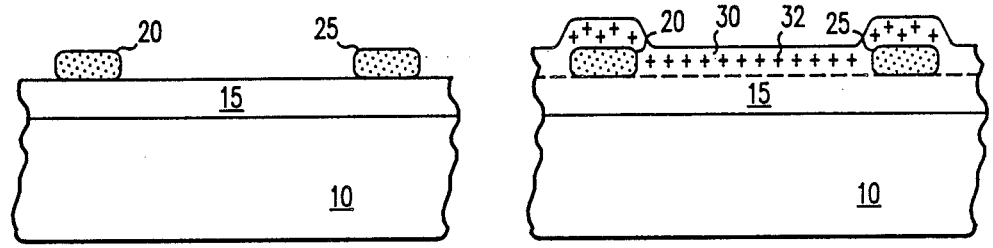
FIG. 5   FIG. 6
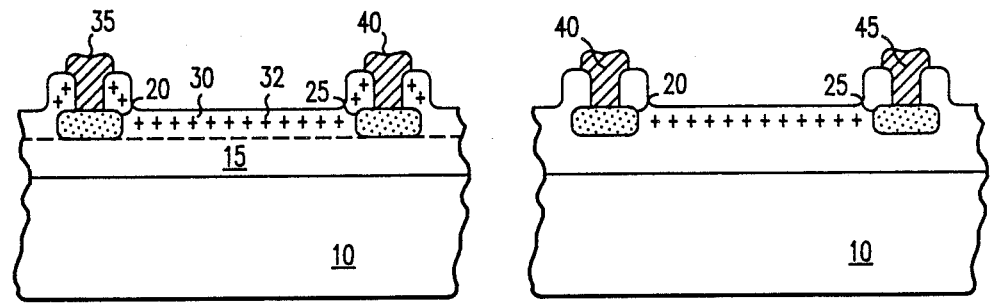
FIG. 7   FIG. 8

DOPED SIO₂ RESISTOR AND METHOD OF FORMING SAME

BACKGROUND OF THE INVENTION

1. Field of the Invention

This invention relates to a method of forming a resistor, and in particular to a method to form an electrically isolated doped silicon-dioxide resistor.

2. Description of Prior Art

There are a variety of prior art methods used to form electrically isolated resistors in integrated circuits. One method of forming an isolated resistor is to form a resistive N region within a P region so as to electrically isolate the N region. Electrodes are then formed which contact the resistive N region. The doping concentration and geometry of the N region determines its resistance value. Another common method of forming a resistor is to form a layer of polycrystalline silicon (poly-Si) on a dielectric layer. The poly-Si layer is then doped to a specific level, patterned to form the resistor, and electrodes are formed to contact the resistor. Still another method of forming a resistor is to deposit a conductive material such as silicon-chrome or nickel-chrome on a dielectric layer, pattern the conductive material, and form electrodes to contact the resistor. No resistor has yet been formed within an integrated circuit which consists of a region of doped $SiO_2$.

The ability of electrons to tunnel through a thin layer of $SiO_2$ and effect a small current through the $SiO_2$ is well known, particularly in the operation of electrically erasable programmable read only memories (EEPROM), where electron tunneling through a thin layer of pure $SiO_2$ to charge and discharge a floating gate is by Fowler-Nordheim tunneling.

The article, "Electronic Conduction Mechanism of Cs- and B-Implanted $SiO_2$-Films", by W. Gartner, et al., Applied Physics 12, 137–148 (1977), discusses various tunneling mechanisms through an $SiO_2$ film after implantation of Cs and B ions into the film. This article, herein incorporated by reference, describes how implantation of cesium (Cs) or boron (B) ions into an $SiO_2$ film generally changes the conduction mechanism through the $SiO_2$ from Fowler-Nordheim tunneling to Frenkel-Poole tunneling. The article also noted that a strong increase in the current through the $SiO_2$ at high electric fields was observed after Cs-implantation, while B-implantation led to a decrease in the current at high electric fields. This effect is caused by field-enhanced emission and trapping of charged particles, respectively.

The article focuses on determining the current mechanism in thermally grown $SiO_2$ films in MOS structures by using ion implantation to vary the current vs. voltage characteristics of the oxide. Current vs. voltage characteristics for the B and Cs ion implantations were plotted and analyzed in order to determine the conduction mechanism in the $SiO_2$ film in response to low, medium and high electric fields. The structure under test is shown in FIG. 1, wherein a boron-doped silicon wafer with a resistivity of 2 to 3 $\Omega$·cm and a <111> crystal orientation has grown on it a layer of $SiO_2$ approximately 600 Å thick. An aluminum contact 0.5 mm in diameter and 1500 Å thick was then evaporated on the $SiO_2$ layer and another aluminum contact 1500 Å thick was then formed on the bottom of the silicon wafer. Shown in FIG. 2 are the current density vs. electric field characteristics of the undoped $SiO_2$. The current density vs. electric field characteristics for the 600 Å thick layer of $SiO_2$ doped with Cs is shown in FIG. 3 and the characteristics for a 600 Å thick layer of $SiO_2$ doped with B is shown in FIG. 4. The work of Gartner et al. shows that after implantation of the ions, at low electric fields, conduction is by space charged currents, and at medium electric fields, conduction is via the Frenkel-Poole mechanism. The curve shown in FIG. 3 is illustrative of the increase conductivity of $SiO_2$ with implantation of Cs ions, and details of the particular experiment may be found in the reference.

Applying the concept of implanting ions into a thin layer of $SiO_2$ for the purpose of forming a resistor in an integrated circuit would be relatively inexpensive compared to the three methods of forming resistors discussed above.

SUMMARY OF THE INVENTION

The concept of enhancing conduction through $SiO_2$ by implanting ions of cesium (Cs) into the $SiO_2$ is applied to the formation of a resistor in an integrated circuit. Boron may be implanted to decrease conduction through the $SiO_2$. By implanting Cs ions into a controlled region of $SiO_2$, and making contact to it via metal electrodes or a conductive polysilicon (poly-Si) layer, a resistor is formed. The resistance of the resistor is determined by the geometry chosen and by the implant dose and implant energy or energies. One method for forming this resistor comprises oxidizing a silicon wafer, depositing a poly-Si layer, etching the poly-Si layer to form two etch-stop regions, oxidizing the poly-Si, and implanting ions of cesium or boron between the two poly-Si regions with the desired geometry and implant dose and energy. Multiple energies may be used to increase the cross-sectional area of the resistor in order to decrease the resistance and increase current handling capability. An anneal cycle then activates the implanted ions. Contact holes to expose the etch-stop poly-Si regions are then etched, and an interconnect metallization layer is deposited and formed to contact the etch-stop poly-Si regions at the ends of the resistor.

BRIEF DESCRIPTION OF THE DRAWINGS

FIGS. 2–4 show current density vs. electric field characteristics of the $SiO_2$ layer in the structure of FIG. 1 before ion implantation, after Cs implantation, and after B ion implantation, respectively.

FIG. 5 shows a silicon wafer with a $SiO_2$ layer grown over its surface and poly-Si regions formed.

FIG. 6 shows the structure of FIG. 5 with a layer of oxide grown over the structure and cesium ions implanted.

FIG. 7 shows the structure of FIG. 6 with contact holes etched and aluminum contacts deposited.

FIG. 8 shows a variation of the inventive structure of FIG. 7 wherein contact to the doped $SiO_2$ is made through the poly-Si regions.

DETAILED DESCRIPTION

Figure 1:
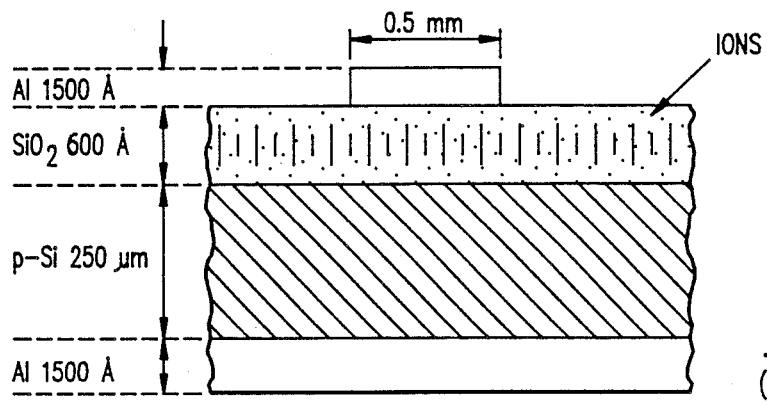
FIG. 1 shows the prior art device under test which produced the current density vs. electric field characteristics of FIGS. 2–4.
Figure 2:
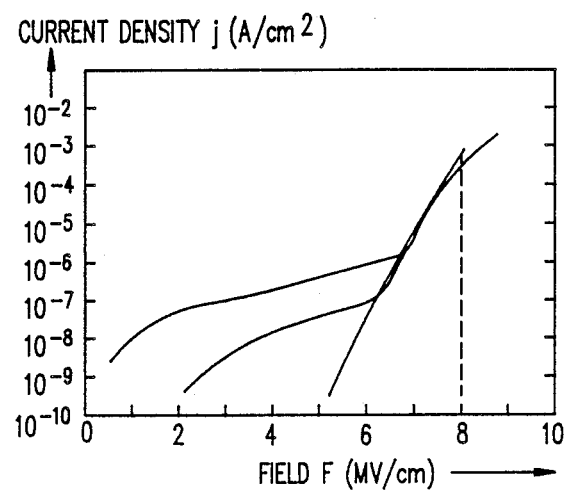
Figure 3:
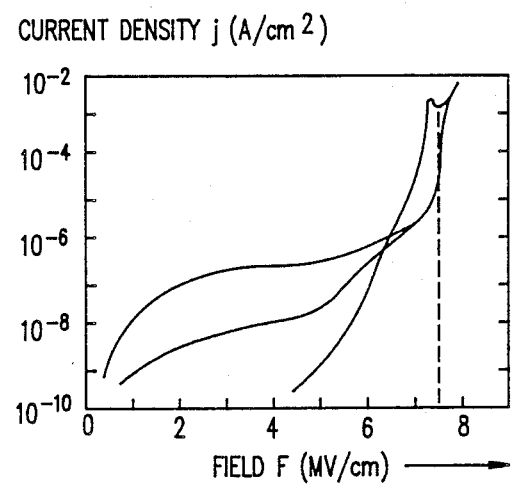

An inventive doped $SiO_2$ resistor is herein described along with its method of manufacture. FIG. 7 shows such a resistor comprising substrate 10, $SiO_2$ layers 15 and 30, poly-Si regions 20, 25, cesium ions 32 implanted into $SiO_2$ layer 30, and aluminum contacts 35, 40. The geometry of the resistor, and the dosage and implant energy of the ions, determine the resistor's conductivity.

A preferred method to form the resistor of FIG. 7 will now be described. In FIG. 5, starting with silicon substrate 10, $SiO_2$ layer 15 is grown or deposited to a nominal thickness of approximately 1000 Å. Next, a layer of polysilicon (poly-Si) is deposited to a thickness of approximately 1000–6000 Å over $SiO_2$ layer 15 and etched to form regions 20, 25 at the extremities of the intended resistor region. Poly-Si regions 20, 25 are to be used as etch-stops in a subsequent etching step.

As shown in FIG. 6, oxide layer 30 is then grown in the field region, including over poly-Si regions 20, 25, to a nominal thickness of approximately 1000 Å over poly-Si regions 20, 25. $SiO_2$ layer 30 is then masked and cesium ions 32 are then implanted in the resistor region defined by the mask. The depth of the implanted ions is determined by the implantation energy. Multiple energy levels may be used to increase the cross-section of the resistor in order to decrease its resistance and to increase its current handling capability. The mean depth of the ions should be approximately even with the top of poly-Si regions 20, 25. The ions are then activated using an anneal cycle.

In FIG. 7, contact regions are formed in $SiO_2$ layer 30, and an aluminum interconnect metallization layer is deposited and formed to form electrodes 35, 40 which contact the doped $SiO_2$ and poly-Si regions 20, 25. Contact to the doped $SiO_2$ can also be made by a conductive poly-Si interconnect layer. Thus, a controlled resistance has been formed between contacts 35 and 40. As seen, poly-Si regions 20, 25 merely act as etch-stops, preventing inadvertent etching to the silicon substrate 10.

In another embodiment, shown in FIG. 8, cesium ions are implanted so the mean depth is level with the middle of conductive poly-Si regions 20, 25. Electrodes 40, 45 are then formed to make contact with poly-Si regions 20, 25, which in turn contact the doped $SiO_2$ to form a resistor.

The present invention has been described with reference to the preferred and alternative embodiments thereof, however, the invention is not intended to be limited to the herein described embodiments. Various modifications in form and structure will be obvious to those skilled in the art while keeping with the spirit and scope of the invention.

I claim:

1. A resistor for use in integrated circuits comprising a region of $SiO_2$, said $SiO_2$ containing ions, and conductive electrodes electrically contacting said region of $SiO_2$ containing ions,
wherein said ions are cesium ions.

2. The resistor of claim 1 wherein said $SiO_2$ containing cesium ions is formed by implanting ions into a region of $SiO_2$.

3. The resistor of claim 1 further comprising conductive polysilicon regions within said region of $SiO_2$ containing cesium ions wherein said conductive electrodes are in electrical contact with said region of $SiO_2$ containing cesium ions through said polysilicon regions.

4. The resistor of claim 1 further comprising polysilicon regions within said region of $SiO_2$ containing cesium ions, said polysilicon regions acting as etch-stops and said conductive electrodes directly electrically contacting said region of $SiO_2$ containing cesium ions.

5. The resistor of claim 3 wherein said region of doped $SiO_2$ containing cesium ions is overlying a layer of pure $SiO_2$ which is, in turn, overlying a substrate.

6. The resistor of claim 4 wherein said region of doped $SiO_2$ containing cesium ions is overlying a layer of pure $SiO_2$ which is, in turn, overlying a substrate.

* * * * *

UNITED STATES PATENT AND TRADEMARK OFFICE
CERTIFICATE OF CORRECTION

PATENT NO. : 4,868,537
DATED : 09/19/89
INVENTOR(S) : Richard A. Blanchard et al.

It is certified that error appears in the above-identified patent and that said Letters Patent is hereby corrected as shown below:

ON THE TITLE PAGE

[75] Inventors should read as follows:

-- Richard A. Blanchard, Los Altos;
   Richard K. Williams, Cupertino;
       both of California. --

Signed and Sealed this

Seventh Day of April, 1992

Attest:

HARRY F. MANBECK, JR.

Attesting Officer     Commissioner of Patents and Trademarks